United States Patent [19]

Zertani et al.

[11] Patent Number: 5,229,253

[45] Date of Patent: * Jul. 20, 1993

[54] PHOTOPOLYMERIZABLE MIXTURE AND RECORDING MATERIAL PRODUCED THEREFROM

[75] Inventors: Rudolf Zertani, Mainz; Dieter Mohr, Budenheim, both of Fed. Rep. of Germany

[73] Assignee: Hoechst Aktiengesellschaft, Frankfurt am Main, Fed. Rep. of Germany

[*] Notice: The portion of the term of this patent subsequent to Sep. 17, 2008 has been disclaimed.

[21] Appl. No.: 666,635

[22] Filed: Mar. 8, 1991

[30] Foreign Application Priority Data

Mar. 9, 1990 [DE] Fed. Rep. of Germany ....... 4007428

[51] Int. Cl.$^5$ ..................... G03C 1/725; G03F 7/028; C08F 2/48; C08J 3/28
[52] U.S. Cl. .................................. 430/281; 430/284; 522/26; 522/29; 522/153; 522/160; 522/182
[58] Field of Search .................. 522/26, 29, 153, 160, 522/182; 430/284, 281

[56] References Cited

U.S. PATENT DOCUMENTS

| | | | |
|---|---|---|---|
| 3,488,269 | 1/1970 | Allen et al. | 204/159.23 |
| 3,597,343 | 8/1971 | Delzenne et al. | 204/159.23 |
| 3,717,558 | 2/1973 | McGinnis | 204/159.15 |
| 3,751,259 | 8/1973 | Bauer et al. | 430/288 |
| 3,759,807 | 9/1973 | Osborn et al. | 204/159.23 |
| 4,054,682 | 10/1977 | Kuesters et al. | 427/54 |
| 4,071,424 | 1/1978 | Dart et al. | 204/159.15 |
| 4,548,891 | 10/1985 | Riediker et al. | 430/283 |
| 4,590,287 | 5/1986 | Riediker et al. | 556/53 |
| 4,636,459 | 1/1987 | Kawamura et al. | 430/288 |
| 4,751,102 | 6/1988 | Adair et al. | 522/26 |
| 4,857,654 | 8/1989 | Riediker et al. | 522/26 |
| 4,937,159 | 6/1990 | Gottschalk et al. | 522/26 |
| 4,963,470 | 10/1990 | Klingert et al. | 430/281 |
| 4,983,498 | 1/1991 | Rode et al. | 430/284 |
| 4,985,341 | 1/1991 | Rode et al. | 522/26 |
| 4,987,055 | 1/1991 | Rode et al. | 430/284 |
| 4,997,745 | 3/1991 | Kawamura et al. | 522/26 |
| 5,008,302 | 4/1991 | Hüsler et al. | 522/26 |
| 5,011,755 | 4/1991 | Rohde et al. | 522/26 |
| 5,049,479 | 9/1991 | Zertani et al. | 430/284 |
| 5,057,398 | 10/1991 | Frommeld et al. | 522/26 |
| 5,066,564 | 11/1991 | Zertani et al. | 430/284 |

FOREIGN PATENT DOCUMENTS

| | | |
|---|---|---|
| 71779/87 | 10/1987 | Australia. |
| 0269573 | 6/1988 | European Pat. Off.. |
| 3839394A1 | 6/1989 | Fed. Rep. of Germany. |
| 50-129214 | 10/1975 | Japan. |
| 2036352 | 6/1980 | United Kingdom ................. 522/26 |

OTHER PUBLICATIONS

Patent Abstract, 92:155901t, Kondo et al., Jpn. Kokai Tokkyo Koho 79,151,024, Nov. 27, 1979.

Primary Examiner—Marion E. McCamish
Assistant Examiner—Susan Berman
Attorney, Agent, or Firm—Foley & Lardner

[57] ABSTRACT

A photopolymerizable mixture is described which comprises a polymeric binder, a compound which is polymerizable by free radicals and has at least one polymerizable group and a photoreducible dye and a dicyclopentadienyl bis(2,4,6-trifluorophenyl)-titanium or -zirconium as photoinitiator. The mixture is suitable for producing printing plates and photoresists and is distinguished by particularly high photosensitivity, in particular in the visible region of the spectrum, and by very good thermal stability. It can be imaged in particular with laser radiation in the visible region.

33 Claims, No Drawings

PHOTOPOLYMERIZABLE MIXTURE AND RECORDING MATERIAL PRODUCED THEREFROM

BACKGROUND OF THE INVENTION

The invention relates to a photopolymerizable mixture containing a polymer binder, a polymerizable compound, in particular an acrylic or alkacrylic ester, and a photoinitiator combination.

Photopolymerizable mixtures containing certain combinations of photoinitiators and activators, for example carbonyl-containing initiators and tertiary amines, for increasing the light sensitivity are known. Mixtures of this type which have a synergistic action are described, for example, in U.S. Pat. Nos. 3,759,807, 4,054,682 and 4,071,424. A disadvantage of these mixtures containing low-molecular-weight amines is that they have low stability on storage, since the amines tend to exude easily, in particular from thin films.

JP-A 50/129,214 (applied for on Apr. 2, 1974 under the number 49/36,614) describes a photopolymerizable mixture containing a tetra(meth)acrylic ester of an N,N,N',N'-tetrahydroxyalkylalkylenediamine as the polymerizable compound. The tetrafunctional compound serves as crosslinking agent.

Furthermore, it is known to initiate the free-radical polymerization of ethylenically unsaturated compounds by irradiation with visible light in the presence of photoreducible dyes and reducing agents, for example amines (U.S. Pat. No. 3,097,096). However, these initiator combinations are in most cases only used in aqueous solution or in a combination with water-soluble binders. Initiator combinations comprising photoreducible dyes and other reducing agents are described in U.S. Pat. Nos. 3,597,343 and 3,488,269.

Photopolymerizable mixtures containing exclusively photoreducible dyes as initiators have so far not been used in practice, due to their low light sensitivity. JP-A 54/151,024 describes a photopolymerizable mixture containing an initiator combination comprising a merocyanine dye and a trihalomethyl-substituted s-triazine, which is sensitive to visible light, for example an argon laser. However, the sensitivity of these mixtures to visible laser light is not sufficient for industrial applications.

EP-A 287,817 describes photopolymerizable mixtures containing (meth)acrylic esters having urethane groups, tertiary amino groups and possible urea groups in the molecule, polymer binders and, as photoinitiators, a combination comprising a photoreducible dye, a radiation-sensitive trihalomethyl compound and an acridine, phenazine or quinoxaline compound.

EP-A 321,826 describes a similar mixture containing (meth)acrylic esters but no urethane groups.

U.S. Pat. No. 3,717,558 describes metallocenes of elements of subgroups IIa to VIIIa in combination with a further photoinitiator containing a carbonyl chloride group for use in photopolymerizable recording materials. These initiator combinations are very sensitive to oxygen and hydrolysis and therefore less suitable for producing printing plates and resist materials. Further metallocenes and their use as photoinitiators in photopolymerizable mixtures are described in EP-A 119,162 and 122,223. These are titanocenes having good resistance to air and exhibiting spectral sensitivity in the range from UV light to visible light. They contain, inter alia, cyclopentadienyl radicals and fluorinated phenyl radicals as ligands. Furthermore, EP-A 242,330 and 269,573 describe photopolymerizable mixtures containing a photoinitiator mixture comprising a titanocene and a liquid photoinitiator of the hydroxy- or aminoacetophenone type. In these materials, the obtainable light sensitivity is not sufficient for rapid imaging using a low-energy and, at the same time, low-cost argon ion laser.

The older European Patent Application 89117004.5, which is not a prior publication, describes photopolymerizable mixtures containing: a polymer binder; a compound which is polymerizable by free radicals and contains at least one polymerizable group; a photoreducible dye; a trihalomethyl compound which can be cleaved by radiation; and a metallocene compound, in particular a titanocene or zirconocene.

The metallocenes used are those carrying two substituted or unsubstituted cyclopentadienyl radicals and two substituted phenyl radicals as ligands. The phenyl radicals carry at least one fluorine atom in the o position relative to the bond and contain, if desired, further substituents, such as Cl, Br, alkyl or alkoxy groups; the compounds which are preferred and described in the examples are those containing pentafluorophenyl radicals. These mixtures have extremely high light sensitivity. However, their stability on storage is limited, in particular at elevated temperatures.

SUMMARY OF THE INVENTION

Accordingly, it is an object of the present invention to provide a photopolymerizable mixture that is suitable for producing long-run printing plates and photoresists of high resistance to processing solutions in the cured state, which mixture displays a high light sensitivity in the near ultraviolet and visible regions of the spectrum.

Another object of the present invention is to provide a mixture having good thermal storage stability.

A further object of the present invention is to provide a mixture suitable in particular for laser beam recording in the visible region.

Yet another object of the present invention is to provide a photopolymerizable recording material comprising the foregoing mixture.

In accomplishing the foregoing objectives, there has been provided, in accordance with one aspect of the present invention, a photopolymerizable mixture comprising a polymeric binder, a free-radical polymerizable compound having at least one polymerizable group, a photoreducible dye, and a dicyclopentadienyl bis(2,4,6-trifluorophenyl)-titanium or -zirconium.

In accordance with another aspect of the present invention there is provided a photopolymerizable recording material comprising a support and a photopolymerizable layer, wherein the photopolymerizable layer comprises a mixture as defined above.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The metallocenes used as a constituent of the initiator are known as such and also as photoinitiators, for example from U.S. Pat. No. 4,590,287, the contents of which are incorporated by reference. Titanium compounds are preferred. Compounds of this type are described, for example, in EP-A 119,162 and 122,223, corresponding to U.S. Pat. Nos. 4,548,891 and 4,590,287, which are hereby incorporated by reference.

The cyclopentadienyl groups can be substituted in particular by alkyl radicals having 1 to 4 carbon atoms, chlorine atoms, phenyl or cyclohexyl radicals or linked to one another by alkylene groups. The cyclopentadienyl groups are preferably either unsubstituted or substituted by alkyl radicals or chlorine atoms. The percentage of the metallocene compound is in general between about 0.01 and 10, preferably from about 0.05 to 6% by weight, relative to the non-volatile portions of the mixture.

The mixture according to the invention contains a photo-reducible dye as a further photoinitiator constituent. Suitable dyes are in particular xanthene, benzoxanthene, benzothioxanthene, thiazine, pyronine, porphyrin or acridine dyes.

Suitable xanthene and thiazine dyes are described, for example, in EP-A 287,817, corresponding to U.S. Ser. No. 07/173,559, hereby incorporated by reference. Suitable benzoxanthene and benzothioxanthene dyes are described in DE-A 2,025,291, and in EP-A 321,828, corresponding to U.S. Ser. No. 07/287,276, which is incorporated by reference.

An example of a suitable porphyrin dye is haematoporphyrin and an example of a suitable acridine dye is acriflavinium chloride hydrochloride.

Examples of xanthene dyes are Eosin B (C.I. No. 45400), Eosin J (C.I. No. 45380), Eosin alcohol-soluble (C.I. 45386), Cyanosine (C.I. No. 45410), Rose Bengal, Erythrosine (C.I. No. 45430), 2,3,7-trihydroxy-9-phenylxanthen-6-one and Rhodamin 6 G (C.I. No. 45160).

Examples of thiazine dyes are thionine (C.I. No. 52000), Azure A (C.I. No. 52005) and Azure C (C.I. No. 52002).

Examples of pyronine dyes are Pyronin B (C.I. No. 45010) and Pyronin GY (C.I. No. 45005). The amount of photoreducible dye is in general between about 0.01 and 10, preferably between about 0.05 and 4, % by weight, relative to the non-volatile portions of the mixture.

For increasing the light sensitivity, the mixtures according to the invention preferably additionally contain compounds having trihalomethyl groups which can be cleaved photolytically, these compounds being known per se as free-radical forming photoinitiators for photopolymerizable mixtures. In particular, compounds containing chlorine and bromine, in particular chlorine, as halogens have proved suitable as coinitiators of this type. The trihalomethyl groups can be bound to an aromatic carbo- or heterocyclic ring directly or via a conjugated chain. Preference is given to compounds having a triazine ring in the parent structure which in turn preferably carries 2 trihalomethyl groups, in particular to those described in EP-A 137,452, DE-A 2,718,259 and DE-A 2,243,621. These compounds strongly absorb light in the near UV region, around 350-400 nm. Coinitiators which themselves do not or only slightly absorb in the spectral region of the copy light, such as trihalomethyltriazines containing substituents having shorter electron systems capable of resonance or aliphatic substituents are also suitable. Compounds with a different parent structure, which absorb in the shorter UV wavelength region, for example phenyl trihalomethyl sulfones or phenyl trihalomethyl ketones, for example phenyl tribromomethyl sulfone, are also suitable.

These halogen compounds are in general used in an amount of about 0.01 to 10, preferably about 0.05 to 4, % by weight, relative to the non-volatile constituents of the mixture.

The mixtures according to the invention contain, if desired, an acridine, phenazine or quinoxaline compound, i.e., compounds having an acridine, phenazine or quinoxaline moiety, as a further initiator constituent. These compounds are known as photoinitiators and described in DE-C 2,027,467 and 2,039,861, corresponding to U.S. Pat. Nos. 3,751,259 and 3,765,898, hereby incorporated in their entireties by reference. These compounds increase the sensitivity of the mixture, in particular in the near ultraviolet region. Suitable representatives of this class of compounds are described in the DE-C mentioned. Examples are acridine substituted in the 9 position, such as 9-phenyl-, 9-p-methoxyphenyl- or 9-acetylaminoacridine, or acridine derivatives having fused-on aromatic rings, for example benz[a]acridine. A suitable phenazine derivative is, for example, 9,10-dimethylbenz[a]phenazine. Suitable quinoxaline derivatives are in particular 2,3-diphenyl derivatives which are preferably further substituted in the two phenyl radicals by methoxy groups. In general, the acridine derivatives are preferred. The amount of this component in the mixture is in the range from about 0 to about 10% by weight, preferably between about 0.05 and 5% by weight. If a further increase in the sensitivity of the mixture in the visible region of the spectrum is desired, this increase can be achieved by adding a compound of the dibenzalacetone or coumarin type. This addition results in higher resolution of the copy and continuous sensitization of the mixture to the visible region of the spectrum up to wavelengths of about 600 nm. Suitable representatives of these compounds are 4,4'-disubstituted dibenzalacetones, for example diethylamino-4'-methoxydibenzalacetone, or coumarin derivatives, such as 3-acetyl-7-diethylamino-, 3-benzimidazolyl-7-diethylamino- or carbonyl-bis(7-diethylaminocoumarin). The amount of this compound is in the range from 0 to about 10, preferably about 0.05 to 4, % by weight, relative to the non-volatile components of the mixture. The total amount of polymerization initiators is in general about 0.05 to 20, preferably about 0.1 to 10, % by weight.

Polymerizable compounds which are suitable for the purposes of the invention are known and described, for example, in U.S. Pat. Nos. 2,760,863 and 3,060,023, the contents of which are incorporated by reference.

Preferred examples are acrylic and methacrylic esters of di- or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols or N-substituted acryl- and methacrylamides. Reaction products of mono- or diisocyanates with partial esters of polyhydric alcohols are also advantageously used. Monomers of this type are described in DE-A 2,064,079, 2,361,041 and 2,822,190.

Polymerizable compounds containing at least one photooxidizable and, if desired, at least one urethane group in the molecule are particularly preferred. Suitable photooxidizable groups are in particular amino groups, urea groups, thio groups, which can also be constituents of heterocyclic rings, enol groups and carboxyl groups in combination with olefinic double bonds. Examples of groups of this type are triethanolamino, triphenylamino, thiourea, imidazole, oxazole, thiazole, acetylacetonyl, N-phenylglycine and ascorbic acid groups. Polymerizable compounds having primary, secondary and in particular tertiary amino groups are preferred.

Examples of compounds containing photooxidizable groups are acrylic and alkacrylic esters of the formula I

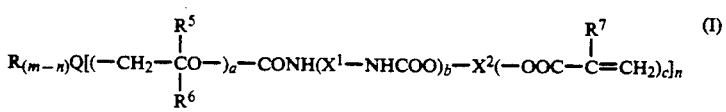

in which
Q is

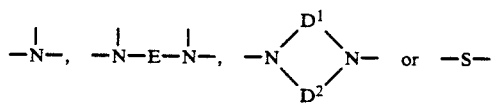

R is an alkyl, hydroxyalkyl or aryl group,
$R^5$ and $R^6$ are each a hydrogen atom, an alkyl group or an alkoxyalkyl group,
$R^7$ is a hydrogen atom, a methyl group or ethyl group,
$X^1$ is a saturated hydrocarbon group having 2 to 12 carbon atoms,
$X^2$ is a (c+1)-valent saturated hydrocarbon group in which up to 5 methylene groups can be replaced by oxygen atoms,
$D^1$ and $D^2$ are each a saturated hydrocarbon group having 1 to 5 carbon atoms,
E is a saturated hydrocarbon group of 2 to 12 carbon atoms, a cycloaliphatic group of 5 to 7 ring members, which, if desired, can contain up to two N, O or S atoms as ring members, an arylene group of 6 to 12 carbon atoms or a heterocyclic aromatic group of 5 or 6 ring members,
a is 0 or a number from 1 to 4,
b is 0 or 1,
c is an integer from 1 to 3,
m is, depending on the valency of Q, 2, 3 or 4 and
n is an integer from 1 to m,
it being possible for all symbols of the same definition to be identical to or different from one another. The compounds of this formula, their preparation and use are described in detail in EP-A 287,818, corresponding to U.S. Ser. No. 07/173,936, hereby incorporated by reference. If in the compound of the general formula I more than one radical R or more than one radical of the type indicated in square brackets is bound to the central group Q, these radicals can be different from one another.

Compounds in which all substituents of Q are polymerizable radicals, i.e. in which m is n, are in general preferred. In general, a is 0 in not more than one radical, preferably in no radical; preferably a is 1.

If R is an alkyl or hydroxyalkyl group, this group has in general 2 to 8, preferably 2 to 4, carbon atoms. The aryl radical R can in general be mononuclear or binuclear, preferably it is mononuclear, and it may be substituted by alkyl or alkoxy groups of up to 5 carbon atoms or halogen atoms.

If $R^5$ and $R^6$ are alkyl or alkoxyalkyl groups, they can contain 1 to 5 carbon atoms. $R^7$ is preferably a hydrogen atom or a methyl group, in particular a methyl group.

$X^1$ is preferably a straight-chain or branched aliphatic or cycloaliphatic radical of, preferably, 4 to 10 carbon atoms. $X^2$ preferably has 2 to 15 carbon atoms, up to 5 of which can be replaced by oxygen atoms. If pure carbon chains are involved, those having 2 to 12, preferably 2 to 6, carbon atoms are in general used. $X^2$ can also be a cycloaliphatic group of 5 to 10 carbon atoms, in particular a cyclohexylene group. $D^1$ and $D^2$ can be identical or different and, together with the two nitrogen atoms, form a saturated heterocyclic ring having 5 to 10, preferably 6, ring members.

If E is an alkylene group, it preferably has 2 to 6 carbon atoms, and as an arylene group it is preferably a phenylene group. Preferred cycloaliphatic groups are cyclohexylene groups, preferred aromatic heterocycles are those having N or S as hetero atoms and 5 or 6 ring members. The value of c is preferably 1.

Further suitable compounds containing photooxidizable groups are compounds of the formula II

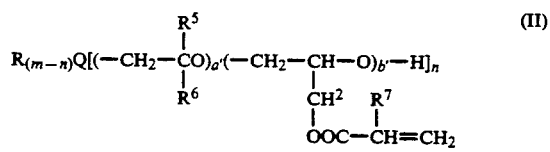

in which Q, R, $R^5$, $R^6$, $R^7$, m and n have the above-mentioned meaning and Q can additionally be a group

in which E' is a group of the formula III

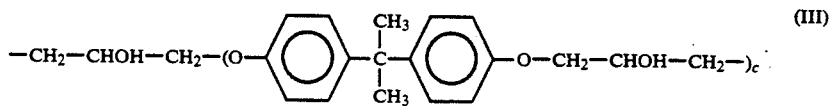

in which c has the meaning as in formula I; a' and b' are integers from 1 to 4.

The compounds of this formula, their preparation and use are described in detail in EP-A 316,706, corresponding to U.S. Ser. No. 07/270,351, which is incorporated by reference.

Further suitable compounds having photooxidizable groups are acrylic and alkacrylic esters of the formula IV

in which $Q^1$ is

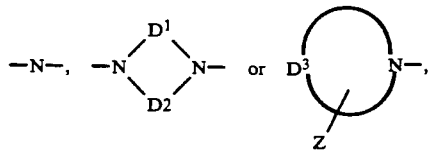

$X^{1'}$ is $C_iH_{2i}$ or

$D^3$ is a saturated hydrocarbon group having 4 to 8 carbon atoms which, together with the nitrogen atom, forms a 5- or 6-membered ring, Z is a hydrogen atom or a radical of the formula

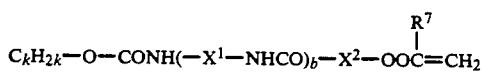

i and k are integers from 1 to 12, n' is, depending on the valency of Q', 1, 2 or 3, and $R^7$, $X^1$, $X^2$, $D^1$, $D^2$, a and b have the meaning given under formula I, it being possible for all symbols of the same definition to be identical to or different from one another, and a, in at least one substituent on the group Q, being 0.

Of the compounds of the formula IV, those are preferred which contain at least one urethane group apart from a urea group. Urea groups are considered to be groups of the formula

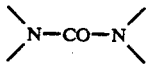

in which the valencies on the nitrogen are saturated with unsubstituted or substituted hydrocarbon radicals. However, one valency on a nitrogen atom can also be bound to a further carboxamido group (CONH), resulting in a biuret structure.

The symbol a in formula IV is preferably 0 or 1; i is preferably a number from 2 to 10.

The polymerizable compounds of the formula IV are prepared analogously to the compounds of the formula I. The compounds of the formula IV and their preparation are described in detail in EP-A 355,387, which corresponds to U.S. Ser. No. 07/381,828, hereby incorporated by reference.

The percentages of polymerizable compounds in the photopolymerizable film is in general about 10 to 80, preferably about 20 to 60, % by weight, relative to the non-volatile components.

Examples of binders which can be used are chlorinated polyethylene, chlorinated polypropylene, polyalkyl (meth)acrylates, in which the alkyl group is, for example, methyl, ethyl, n-butyl, i-butyl, n-hexyl or 2-ethylhexyl, copolymers of the alkyl (meth)acrylates with at least one monomer, such as acrylonitrile, vinyl chloride, vinylidene chloride, styrene or butadiene; polyvinyl chloride, vinyl chloride/acrylonitrile copolymers, polyvinylidene chloride, vinylidene chloride/acrylonitrile copolymers, polyvinyl acetate, polyvinyl alcohol, polyacrylonitrile, acrylonitrile/styrene copolymers, acrylonitrile/butadiene/styrene copolymers, polystyrene, polymethylstyrene, polyamides (for example nylon-6), polyurethanes, methyl cellulose, ethyl cellulose, acetyl cellulose, polyvinyl formal and polyvinyl butyral.

Binders which are insoluble in water, soluble in organic solvents and soluble or at least swellable in aqueous alkaline solutions are particularly suitable.

Carboxyl-containing binders, for example copolymers comprising (meth)acrylic acid and/or unsaturated homologues thereof, such as crotonic acid, copolymers of maleic anhydride or its monoesters, reaction products of hydroxyl-containing polymers with dicarboxylic anhydrides and mixtures thereof, should be mentioned in particular.

Reaction products of polymers carrying groups with acidic hydrogen, which have been completely or partially reacted with activated isocyanates, such as, for example, reaction products of hydroxyl-containing polymers with aliphatic or aromatic sulfonyl isocyanates or phosphinyl isocyanates, are also suitable.

The following are also suitable: hydroxyl-containing polymers, such as, for example, hydroxyalkyl (meth)acrylate copolymers, allyl alcohol copolymers, vinyl alcohol copolymers, polyurethanes or polyesters, and epoxy resins, as long as they carry a sufficient number of free OH groups or are modified in such a manner that they are soluble in aqueous-alkaline solutions, or polymers of this kind carrying aromatically bound hydroxyl groups, such as, for example, condensation products of condensable carbonyl compounds, in particular formaldehyde, acetaldehyde or acetone, with phenols or hydroxystyrene copolymers. Finally, copolymers of (meth)acrylamide with alkyl (meth)acrylates can also be used.

The polymers described above are suitable in particular if they have a molecular weight between about 500 and 200,000 or more, preferably about 1,000 to 100,000, and either acid numbers between about 10 and 250, preferably about 20 to 200, or hydroxyl numbers between about 50 and 750, preferably about 100 to 500.

The following preferred alkali-soluble binders may be mentioned: copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinyl acetic acid with alkyl (meth)acrylates, copolymers of maleic anhydride with substituted or unsubstituted styrenes, unsaturated hydrocarbons, unsaturated ethers or esters, esterification products of maleic anhydride copolymers, esterification products of hydroxyl-containing polymers with anhydrides of di- or polycarboxylic acids, copolymers of hydroxyalkyl (meth)acrylates with alkyl (meth)acrylates, (meth)acrylonitrile or the like, copolymers of allyl alcohol with substituted or unsubstituted styrenes, copolymers of vinyl alcohol with alkyl (meth-)acrylates or other polymerizable unsaturated compounds, polyurethanes, as long as they have a sufficient number of free OH groups, epoxy resins, polyesters, partially hydrolyzed vinyl acetate copolymers, polyvinyl acetals having free OH groups, copolymers of hydroxystyrenes with alkyl (meth)acrylates or the like, phenol/formaldehyde resins, for example novolaks. The amount of the binder in the photosensitive layer is in general about 20 to 90, preferably about 40 to 80, % by weight.

Depending on the intended use and the desired properties, a wide range of substances can be present as additives in the photopolymerizable films. Examples are: inhibitors for preventing thermal polymerization of the monomers, hydrogen donors, dyes, colored and uncolored pigments, color formers, indicators, plasticizers and chain-transfer agents. These components are advantageously selected in such a manner that they have the lowest possible absorption in the actinic radiation region important for the initiation process.

In the context of this description, actinic radiation is understood to mean any radiation whose energy corresponds at least to that of visible light. In particular visible light and long-wave UV radiation, but also short-wave UV radiation, laser radiation, electron and X-ray radiation are suitable. The photosensitivity ranges from about 300 nm to 700 nm and thus embraces a very wide range. The combination of photoreducible dyes with photolytically cleavable halogen compounds and metallocenes gives an initiator system having a synergistic effect and an activity in photopolymerizable mixtures, particularly in the long-wave region of the spectrum at or above 455 nm, which is superior to the known photoinitiator combinations. The specific metallocenes used according to the invention, in particular dicyclopentadienyl bis(2,4,6-trifluorophenyl)titanium, surprisingly lead to very good thermal stability of the layers, in addition to very high photosensitivity.

Particularly high photosensitivities are obtained in combination with polymerizable compounds containing photooxidizable groups. By replacing acridine, phenazine or quinoxaline compounds, which are present as coinitiators in otherwise identical photopolymerizable mixtures, such as described, for example, in Ep-A 287,817, by the metallocene compounds described above or by the use of metallocenes in addition to the multinuclear heterocycles mentioned, mixtures of substantially higher photosensitivity are obtained. The mixtures according to the invention exhibit considerably higher photosensitivity even compared with mixtures containing known initiator combinations containing metallocenes.

Possible applications for the material according to the invention are: recording layers for the photomechanical production of printing plates for relief printing, offset printing, intaglio printing, screen printing, relief copies, for example production of texts in braille, of individual copies, tanned images, pigment images, and the like. Furthermore, the mixtures can be used for the photomechanical production of etch resists, for example for manufacturing name tags, copied circuits and for chemical milling.

The mixtures according to the invention are of particular importance as recording layers for the production of planographic printing plates and for the photoresist technique. Examples of suitable supports for the recording material according to the invention are aluminum, steel, zinc, copper and plastic sheets, for example those made of polyethylene terephthalate or cellulose acetate, and screen printing supports, such as perlon gauze. In many cases, it is advantageous to subject the surface of the support to a pretreatment (chemically or mechanically), with the aim of properly adjusting the adhesion of the layer, to improve the lithographic properties of the surface of the support or to reduce the reflectance of the support in the actinic region of the copying layer (antihalation).

The photosensitive materials are produced in a known manner. Thus, the film components can be taken up in a solvent and the solution or dispersion can be applied to the intended support by pouring, spraying, dipping, roller application and the like, and then dried. Due to the broad spectral sensitivity of the recording material according to the invention, all light sources known to one skilled in the art can be used, for example tubular lamps, xenon flash lamps, metal halide-doped mercury high-pressure lamps and carbon arc lamps. In addition, exposure in customary projection and magnification apparatuses to the light of metal filament lamps and contact exposure using conventional light bulbs is possible with the photosensitive mixtures according to the invention. Exposure to the coherent light of a laser is also possible. Lasers which are suitable for the purposes of the present invention are lasers of adequate power, for example argon-ion, krypton-ion, dye, helium/cadmium and helium/neon lasers which emit in particular between about 250 and 650 nm. The laser beam can be adjusted by means of a predetermined programmed line and/or scanning mode.

It is in general advantageous to protect the mixtures during the photopolymerization substantially against the effect of air oxygen. In the case where the mixture is applied in the form of thin copying layers, it is recommended to apply a suitable top film which has low permeability to oxygen. This film may be self-supporting and removed before developing the copying layer. For this purpose, for example, polyester films are suitable. The top film can also be made of a material which is soluble in the developer liquid or can at least be removed at the uncured areas during the development.

Examples of materials which are suitable for this are polyvinyl alcohol, polyphosphates, sugars, and the like. Top coats of this type in general have a thickness of about 0.1 to 10, preferably about 1 to 5, $\mu$m. Further processing of the materials is carried out in a known manner. To improve the crosslinking of the film, additional heating can take place after exposure. For development, the films can be treated with a suitable developer solution, for example, with organic solvents, but preferably with a weakly alkaline aqueous solution, in which the unexposed portions of the layer are removed and the exposed areas of the copying layer remain on the support. The developer solutions can contain a small portion, preferably less than 5% by weight, of water-miscible organic solvents. They can further contain wetting agents, dyes, salts and other additives.

The development removes the entire top coat together with the unexposed areas of the photopolymerizable layer.

Working examples of the invention are given below. Therein, parts by weight (pbw) relate to parts by volume (pbv) as the gram relates to cubic centimeters. Percentages and amounts are by weight, unless stated otherwise.

EXAMPLES 1-6

Comparative Examples

Electrochemically roughened and anodized aluminum having an oxide layer of 3 g/m$^2$ and having been pretreated with an aqueous solution of polyvinylphosphonic acid was used as the support for printing plates. The support was coated with a solution of the following composition. All these operations were carried out under red light:

- 2.84 pbw of a 22.3% strength solution of a terpolymer comprising styrene, n-hexyl methacrylate and methacrylic acid (10:60:30) and having an acid number of 190 in methyl ethyl ketone,
- 1.49 pbw of one of the monomers according to Table 1,
- 0.04 pbw of Eosin alcohol-soluble (C.I. 45386),
- 0.03 pbw of 2,4-bis-trichloromethyl-6-(4-styrylphenyl)-s-triazine and
- 0.01 pbw of dicyclopentadienylbis-(pentafluorophenyl)titanium in
- 22 pbw of propylene glycol monomethyl ether.

The mixture was applied by spin-coating in such a manner that a dry weight of 2.4 to 2.8 g/m$^2$ was obtained. The plate was then dried for 2 minutes at 100° C. in a through-circulation drying oven. The plate was then coated with a 15% strength aqueous solution of polyvinyl alcohol (12% of residual acetyl groups, K value 4). After drying, a top coat having a weight of 2.5 to 4 g/m$^2$ was obtained. The printing plate obtained was exposed to the light of a 2 kW metal halide lamp at a distance of 110 cm. under a 13-step exposure wedge having density increments of 0.15. To test the sensitivity of the printing plates in visible light, a 3 mm thick cut-off filter from Schott with a transmittance edge of 455 nm and a silver film having a uniform optical density (density 1.4) and uniform absorption over the effective spectral range as a gray filter were mounted on the exposure wedge. The plates were exposed for 20 seconds and then heated to 100° C. for one minute. They were then developed using a developer of the following composition:

- 120 pbw of sodium metasilicate × 9 H$_2$),
- 2.13 pbw of strontium chloride,
- 1.2 pbw of nonionic wetting agent (coconut fatty alcohol/polyoxyethylene ether having about 8 oxyethylene units) and
- 0.12 pbw of antifoam in
- 4000 pbw of fully deionized water.

The plates were coated with fatty printing ink. The fully crosslinked wedge steps given in Table 2 were obtained.

TABLE 1

| Example No. | Monomer |
|---|---|
| 1 | Reaction product of 1 mol of triethanolamine with 3 mol of isocyanatoethyl methacrylate, |
| 2 | Reaction product of 1 mol of N,N'-bis)β-hydroxyethyl)-piperidine with 2 mol of isocyanatoethyl methacrylate, |
| 3 | Reaction product of 1 mol of triethanolamine with 3 mol of glycidyl methacrylate, |
| 4 | Reaction product of 1 mol of 2,2,4-trimethylhexamethylene diisocyanate with 2 mol of 2-hydroxyethyl methacrylate, |
| 5 | Reaction product of 1 mol of hexamethylene diisocyanate with 1 mol of 2-hydroxyethyl methacrylate and 0.33 mol of triethanolamine, |
| 6 | Trimethylolethane triacrylate |

TABLE 2

| Example No. | Gray filter | Wedge steps |
|---|---|---|
| 1 | yes | 8-9 |
| 2 | yes | 9 |
| 3 | yes | 7-9 |
| 4 | yes | 6-7 |
| 5 | yes | 7-9 |
| 6 | yes | —* |
| 6 | no | 3-4 |

*no image

EXAMPLES 7-12

Solutions of the following composition were spin-coated onto the support mentioned in Example 1 under the same conditions as there, in such a manner that in each case a coating weight of 2.5 g/m$^2$ was obtained:

- 2.84 pbw of the terpolymer solution mentioned in Example 1,
- 1.49 pbw of one of the monomers according to TABLE 1,
- 0.04 pbw of Eosin alcohol-soluble (C.I. 45386),
- 0.03 pbw of 2,4-bis(trichloromethyl)-6-(4-styrylphenyl)s-triazine and
- 0.01 pbw of dicyclopentadienyl bis(2,4,6-trifluorophenyl)titanium in
- 22 pbw of propylene glycol monomethyl ether.

After applying a top coat comprising polyvinyl alcohol, the plates were exposed in the same manner as in Example 1 for 20 seconds and then developed. To test the sensitivity of the printing plates in visible light, a 3 mm thick cut-off filter from Schott with a transmittance edge of 455 nm and - if shown - a silver film having a uniform optical density (density 1.1) as gray filter were mounted on the exposure wedge. The fully crosslinked wedge steps listed in Table 3 were obtained:

TABLE 3

| Example No. | Monomer from Example | Gray filter | Wedge steps |
|---|---|---|---|
| 7 | 1 | yes | 9-10 |
| 8 | 2 | yes | 9 |
| 9 | 3 | yes | 10-11 |
| 10 | 4 | yes | 7-8 |
| 11 | 5 | yes | 8 |
| 12 | 6 | yes | —* |
| 12 | 6 | no | 3-5 |

*no image

The printing plates from Examples 1-12 were used to perform a storage test at 80° C. over a period of 4 hours in a through-circulation drying oven. Exposure and development were carried out after 4 hours as described above.

The following result was found: Examples 1-6 did not give an image on the aluminum support. For Examples 7-12, the fully crosslinked wedge steps listed in Table 4 were found.

TABLE 4

| Example No. | Monomer No. | Gray filter | Wedge steps |
|---|---|---|---|
| 7 | 1 | yes | 7-8 |
| 8 | 2 | yes | 8 |
| 9 | 3 | yes | 9-10 |
| 10 | 4 | yes | 5-6 |
| 11 | 5 | yes | 6 |
| 12 | 6 | yes | —* |
| 12 | 6 | no | 1-3 |

*no image

The printing plates stored at 80° C. gave more than 100,000 perfect prints even after a storage time of 4 hours.

EXAMPLE 13

The coating solution from Example 7 was spin-coated onto a biaxially oriented 35 μm thick polyethylene terephthalate film in such a manner that a coating weight of 15 g/m² was obtained after drying. The film was then dried at 100° C. for 3 minutes in a through-circulation drying oven. The film was then laminated onto a cleaned support composed of an insulator plate coated with a 35 μm copper layer at 115° C. and 1.5 m/min.

The film was exposed for 30 seconds to the light of a 2 kW metal halide lamp (distance 140 cm), under a cut-off filter 455 nm, as described in Example 1, using a step wedge as the original, and, after removing the film, was developed for 20 seconds with 0.8% strength sodium carbonate solution in a spraying processor. Six fully crosslinked wedge steps were obtained. The crosslinked film was resistant to iron(III) chloride solution which is common in printed circuit technology. The resistance to etching was good.

What is claimed is:

1. A photopolymerizable mixture comprising:
   a) a polymeric binder,
   b) a free-radical polymerizable acrylic or alkacrylic ester having at least one group which is photooxidizable upon exposure in the presence of said photoreducible dye,
   c) a photoreducible dye, and
   d) a dicyclopentadienyl bis(2,4,6-trifluorophenyl)-titanium or -zirconium.

2. A mixture as claimed in claim 1, further comprising:
   e) a trihalogenomethyl compound which can be cleaved by radiation.

3. A mixture as claimed in claim 2, wherein said trihalogenomethyl compound (e) which can be cleaved by radiation is an s-triazine which is substituted by at least one trihalogenomethyl group or is an aryl trihalogenomethyl sulfone.

4. A mixture as claimed in claim 3, wherein said compound (e) is an s-triazine which is substituted by two trihalogenomethyl groups.

5. A mixture as claimed in claim 2, wherein said halogen is chlorine or bromine.

6. A mixture as claimed in claim 2, wherein said compound (e) is present in an amount from about 0.01 to 10 wt % based on the non-volatile components of the mixture.

7. A mixture as claimed in claim 6, wherein said compound (e) is present in an amount from about 0.05 to 4 wt % based on the non-volatile components of the mixture.

8. A mixture as claimed in claim 6, consisting essentially of the recited components.

9. A mixture as claimed in claim 2, consisting essentially of the recited components.

10. A mixture as claimed in claim 1, wherein in compound (d) at least one of the cyclopentadienyl radicals is substituted.

11. A mixture as claimed in claim 10, wherein said substituent is an alkyl radical having 1 to 4 carbon atoms, a chlorine atom, a phenyl radical or a cyclohexyl radical.

12. A mixture as claimed in claim 10, wherein said cyclopentadienyl radicals are linked to one another by an alkylene group.

13. A mixture as claimed in claim 1, wherein said compound (d) is present in an amount from about 0.01 to 10 wt % relative to the non-volatile components of the mixture.

14. A mixture as claimed in claim 13, wherein said compound (d) is present in an amount from about 0.05 to 6 wt % relative to the non-volatile components of the mixture.

15. A mixture as claimed in claim 1, wherein said photoreducible dye (c) is a xanthene, benzoxanthene, benzothioxanthene, thiazine, pyronine, porphyrine or acridine dye.

16. A mixture as claimed in claim 15, wherein said photoreducible dye (c) is a xanthene, thiazine, pyronine, porphyrine or acridine dye.

17. A mixture as claimed in claim 1, further comprising (f) an acridine, phenazine or quinoxaline compound which is active as a photoinitiator.

18. A mixture as claimed in claim 17, wherein said compound (f) is an acridine compound.

19. A mixture as claimed in claim 17, wherein said compound (f) is present in an amount from about 0 to about 10 wt % based on the non-volatile components of the mixture.

20. A mixture as claimed in claim 19, wherein said compound (f) is present in an amount from about 0.05 to 5 wt % based on the non-volatile components of the mixture.

21. A mixture as claimed in claim 17, consisting essentially of the recited components.

22. A mixture as claimed in claim 1, wherein said binder is water-insoluble and is soluble in aqueous-alkaline solutions.

23. A mixture as claimed in claim 1, which comprises about 10 to 80% by weight of polymerizable compound, about 20 to 90% by weight of polymer binder and about 0.05 to 20% by weight of polymerization initiators activatable by radiation, relative to the non-volatile components of the mixture.

24. A mixture as claimed in claim 1, wherein the acrylic or alkacrylic ester contains an amino group.

25. A mixture as claimed in claim 1, wherein the acrylic or alkacrylic ester contains a tertiary amino group.

26. A mixture as claimed in claim 1, wherein the acrylic or alkacrylic ester contains at least one of an amino group, a urea groups, a thio group, an enol group and a carboxyl group in combination with an olefinic double bond.

27. A mixture as claimed in claim 1, wherein said photooxidizable group is an amino, urea, thio or enol group.

28. A mixture as claimed in claim 1, wherein the acrylic or alkacrylic ester is a compound of the formula I

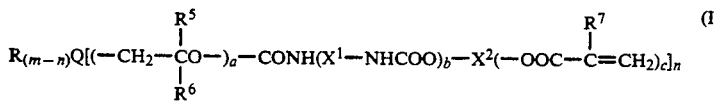

in which Q is

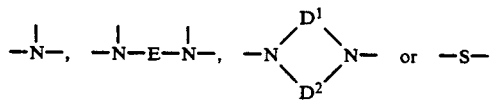 or —S—

R is an alkyl, hydroxyalkyl or aryl group, $R^5$ and $R^6$ are each a hydrogen atom, an alkyl group or an alkoxyalkyl group, $R^7$ is a hydrogen atom, a methyl group or ethyl group, $X^1$ is a saturated hydrocarbon group having 2 to 12 carbon atoms, $X^2$ is a (c+1)-valent saturated hydrocarbon group in which up to 5 methylene groups can be replaced by oxygen atoms, $D^1$ and $D^2$ are each a saturated hydrocarbon group having 1 to 5 carbon atoms, E is a saturated hydrocarbon group of 2 to 12 carbon atoms, a cycloaliphatic group of 5 to 7 ring members, which, if desired, can contain up to two N, O or S atoms as ring members, an arylene group of 6 to 12 carbon atoms or a heterocyclic aromatic group of 5 or 6 ring members, a is 0 or a number from 1 to 4, b is 0 or 1, c is an integer from 1 to 3, m is, depending on the valency of Q, 2, 3 or 4 and n is an integer from 1 to m, it being possible for all symbols of the same definition to be identical to or different from one another.

29. A mixture as claimed in claim 1, wherein the acrylic or alkacrylic ester is a compound of the formula II

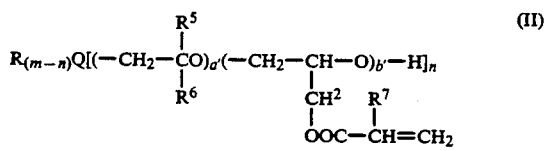

in which

R is an alkyl, hydroxyalkyl or aryl group, $R^5$ and $R^6$ are each a hydrogen atom, an alkyl group or an alkoxyalkyl group, $R^7$ is a hydrogen atom, a methyl group or ethyl group a' and b' are integers from 1 to 4, and Q is

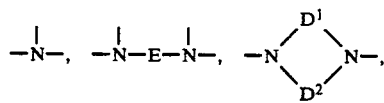

—S— or 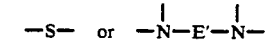

in which E' is a group of the formula III

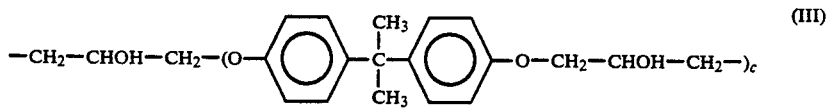

in which c is an integer from 1 to 3.

30. A mixture as claimed in claim 1, wherein the acrylic or alkacrylic ester is a compound of the formula IV

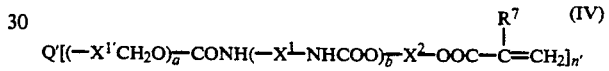

in which $Q^1$ is

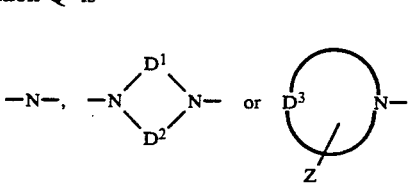

$X^{1'}$ is $C_iH_{2i}$ or

$D^3$ is a saturated hydrocarbon group having 4 to 8 carbon atoms which, together with the nitrogen atom, forms a 5- or 6-membered ring, Z is a hydrogen atom or a radical of the formula

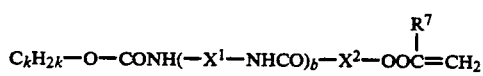

i and k are integers from 1 to 12, n' is, depending on the valency of Q', 1, 2 or 3, $R^7$ is a hydrogen atom, a methyl group or ethyl group, $X^1$ is a saturated hydrocarbon group having 2 to 12 carbon atoms, $X^2$ is a (c+1)-valent saturated hydrocarbon group in which up to 5 methylene groups can be replaced by oxygen atoms, $D^1$ and $D^2$ are each a saturated hydrocarbon group having 1 to 5 carbon atoms, a is 0 or a number from 1 to 4, with the proviso that a is 0 in at least one substitute on the Q, and b is 0 or 1, it being possible for all symbols of the same definition to be identical to or different from one another.

31. A mixture as claimed in claim 1, consisting essentially of the recited components.

32. A photopolymerizable recording material comprising a support and a photopolymerizable layer, wherein said photopolymerizable layer comprises a mixture as claimed in claim 1.

33. A recording material as claimed in claim 32, which further comprises on said photopolymerizable layer, a transparent layer which has low permeability to air oxygen and is soluble in a developer liquid for said photopolymerizable layer.

* * * * *